US010205422B2

United States Patent
Trotta

(10) Patent No.: US 10,205,422 B2
(45) Date of Patent: *Feb. 12, 2019

(54) SYSTEM AND METHOD FOR A VOLTAGE CONTROLLED OSCILLATOR

(71) Applicant: Infineon Technologies AG, Neubiberg (DE)

(72) Inventor: Saverio Trotta, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 142 days.

This patent is subject to a terminal disclaimer.

(21) Appl. No.: 15/266,758

(22) Filed: Sep. 15, 2016

(65) Prior Publication Data

US 2017/0005617 A1    Jan. 5, 2017

Related U.S. Application Data

(63) Continuation of application No. 14/592,415, filed on Jan. 8, 2015, now Pat. No. 9,461,583.

(51) Int. Cl.
| | | |
|---|---|---|
| *H03B 5/12* | (2006.01) | |
| *H03B 1/00* | (2006.01) | |
| *H03B 5/18* | (2006.01) | |
| *H03B 5/24* | (2006.01) | |

(52) U.S. Cl.
CPC .............. *H03B 5/1243* (2013.01); *H03B 1/00* (2013.01); *H03B 5/12* (2013.01); *H03B 5/1209* (2013.01); *H03B 5/1218* (2013.01); *H03B 5/1228* (2013.01); *H03B 5/1231* (2013.01); *H03B 5/1256* (2013.01); *H03B 5/1259* (2013.01); *H03B 5/1847* (2013.01); *H03B 5/24* (2013.01); *H03B 2200/0062* (2013.01); *H03B 2201/0208* (2013.01)

(58) Field of Classification Search
CPC ...... H03B 5/1231; H03B 1/00; H03B 5/1847; H03B 5/1259; H03B 5/1243; H03B 5/12; H03B 5/1256; H03B 2201/0208; H03B 5/1209; H03B 5/1228
USPC ..................... 331/167, 117 FE, 177 V, 117 R
See application file for complete search history.

(56) References Cited

U.S. PATENT DOCUMENTS

| | | | |
|---|---|---|---|
| 7,414,488 B2 | 8/2008 | Lee et al. | |
| 9,099,958 B2 * | 8/2015 | Trotta | ........................ H03B 1/00 |
| 9,461,583 B2 * | 10/2016 | Trotta | .................. H03B 5/1231 |
| 2004/0032303 A1 | 2/2004 | Saito et al. | |
| 2006/0049880 A1 * | 3/2006 | Rein | .................... H03B 5/1847 |
| | | | 331/74 |
| 2006/0049883 A1 | 3/2006 | Mattisson | |

(Continued)

FOREIGN PATENT DOCUMENTS

| | | |
|---|---|---|
| CN | 1682434 A | 10/2005 |
| CN | 1751430 A | 3/2006 |

(Continued)

*Primary Examiner* — Arnold Kinkead
(74) *Attorney, Agent, or Firm* — Slater Matsil, LLP

(57) ABSTRACT

In accordance with an embodiment, a voltage controlled oscillator (VCO) includes a VCO core having a plurality of transistors and a varactor circuit that has a first end coupled to emitter terminals of the VCO core and a second end coupled to a tuning terminal. The varactor circuit includes a capacitance that increases with increasing voltage applied to the tuning terminal with respect to the emitter terminals of the VCO core.

19 Claims, 10 Drawing Sheets

(56) References Cited

U.S. PATENT DOCUMENTS

| | | | |
|---|---|---|---|
| 2006/0226923 | A1 | 10/2006 | Veenstra et al. |
| 2008/0164955 | A1 | 7/2008 | Pfiffer et al. |
| 2011/0128080 | A1 | 6/2011 | Wennekers et al. |
| 2012/0049967 | A1 | 3/2012 | Trivedi |

FOREIGN PATENT DOCUMENTS

| | | | |
|---|---|---|---|
| CN | 101227169 | A | 7/2008 |
| CN | 102904527 | A | 1/2013 |
| DE | 102014114215 | A1 | 4/2015 |
| JP | 2000349551 | A | 12/2000 |
| JP | 2004147310 | A | 5/2004 |

\* cited by examiner

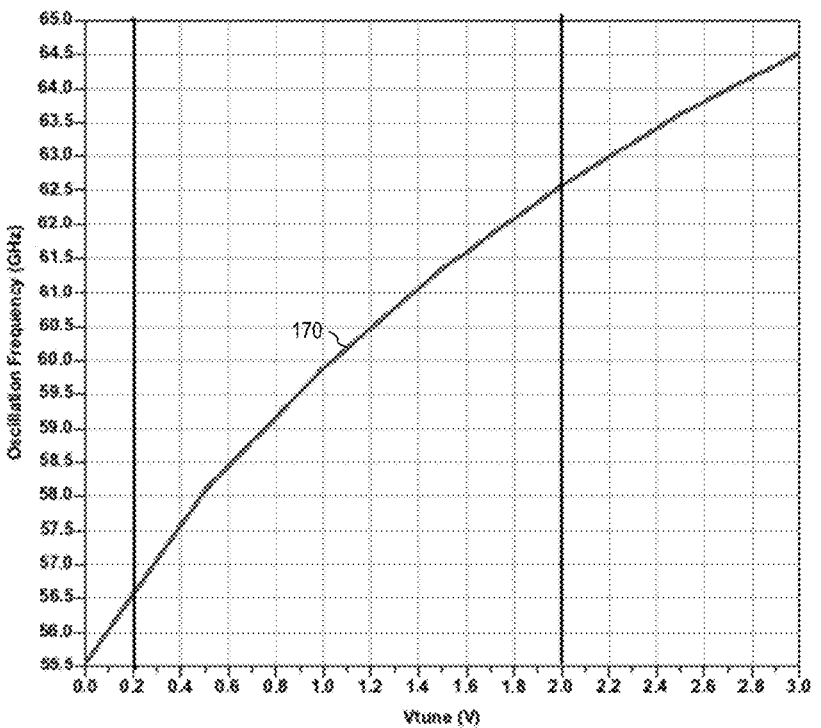
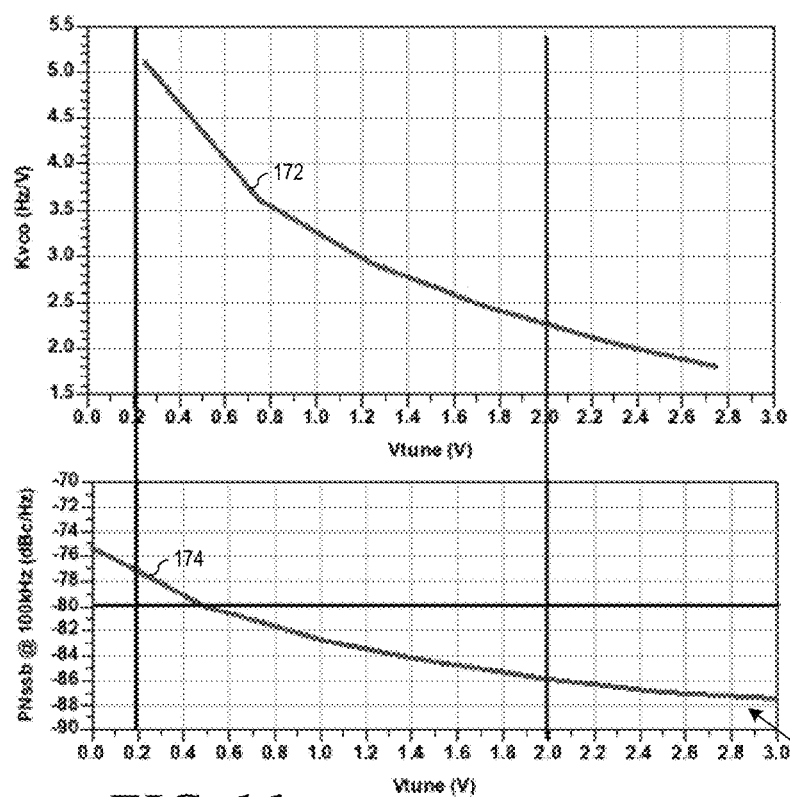
FIG. 1d     Lowest phase noise for largest Vtune

SYSTEM AND METHOD FOR A VOLTAGE CONTROLLED OSCILLATOR

CROSS-REFERENCE TO RELATED APPLICATIONS

This application is a continuation of U.S. Non-Provisional application Ser. No. 14/592,415, filed on Jan. 8, 2015, and issued on Oct. 4, 2016 as U.S. Pat. No. 9,461,583, which application is hereby incorporated herein by reference in its entirety.

TECHNICAL FIELD

The present disclosure relates generally to an electronic device, and more particularly to a system and method for a voltage controlled oscillator (VCO).

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy and sensitivity of the radar system may depend, in part, on the phase noise performance and frequency agility of the radar's frequency generation circuitry, which generally includes an RF oscillator and circuitry that controls the frequency of the RF oscillator.

As the operating frequencies of RF systems continue to increase, however, the generation of signals at such high frequencies poses a major challenge. Oscillators that operate at high frequencies may suffer from a poor phase noise performance that caused by 1/f and thermal noise in the devices that comprise the VCO.

SUMMARY

In accordance with an embodiment, a voltage controlled oscillator (VCO) includes a VCO core having a plurality of transistors and a varactor circuit that has a first end coupled to emitter terminals of the VCO core and a second end coupled to a tuning terminal. The varactor circuit includes a capacitance that increases with increasing voltage applied to the tuning terminal with respect to the emitter terminals of the VCO core.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a radar system, such as an automotive radar system. The invention may also be applied to other systems and applications that use RF oscillators, such as general radar systems and wireless communications systems.

In embodiments of the present invention, the tuning characteristic of the VCO is arranged such that the frequency of the VCO decreases with increasing voltage applied to a varactor circuit of the VCO. By arranging the tuning characteristic of the VCO such that that the VCO decreases with increasing voltage, the region in which the VCO operates with the lowest Kvco and lowest phase noise corresponds with a low or minimum voltage. Accordingly, embodiment VCOs may operate high performance and low noise regions of operation with low control voltages. Such embodiments, for example, are suitable for operation in systems having low supply voltages.

Figure 1A:
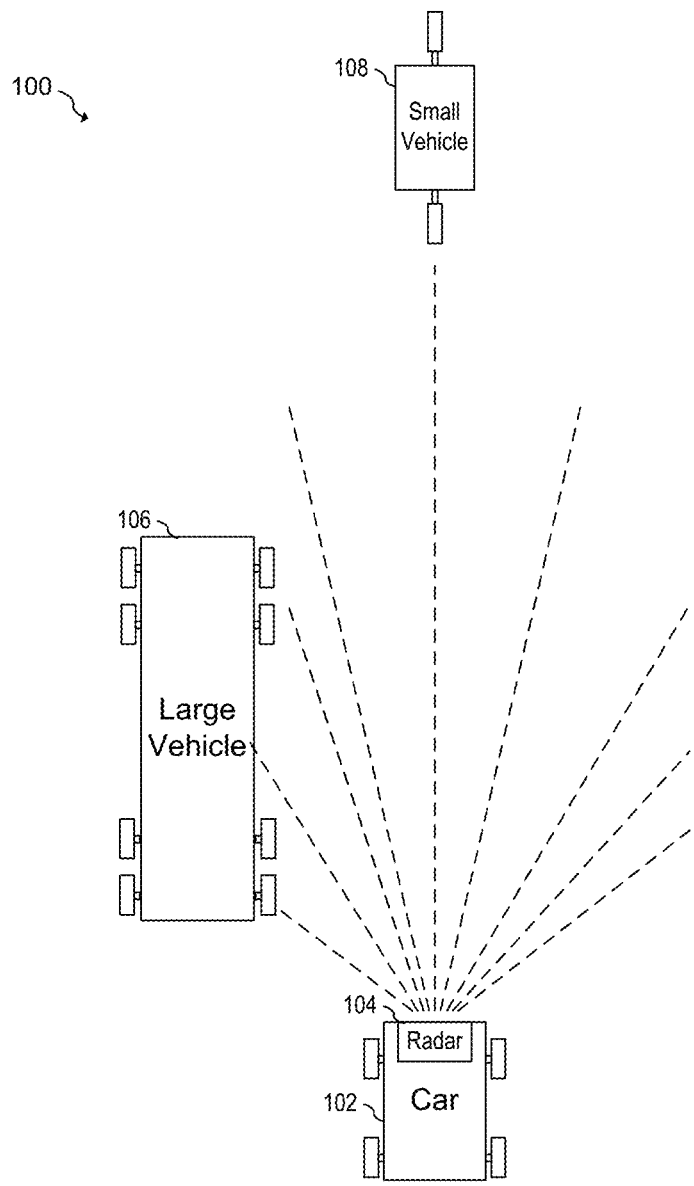
FIG. 1 includes FIGS. 1a and 1b that illustrate the operation of an example automotive radar system, FIG. 1c that illustrates a schematic of a conventional VCO, FIG. 1d that illustrate the performance of the conventional VCO, and FIGS. 1e and 1f that block diagrams of embodiment frequency generation systems.

FIG. 1a illustrates an example automotive radar scenario 100 in which automobile 102 has automotive radar system 104. Automotive radar system 104 transmits and receives, for example, a frequency modulated continuous wave (FMCW) signal, and detects reflections of this transmitted signal in order to determine a distance between automotive radar system 104 and other vehicles or objects on the road. In the illustrated scenario, a large vehicle 106, such as a truck is closer to automobile 102 then a small vehicle 108, such as a motorcycle. Under normal operating conditions, the echo or reflection off large vehicle 106 will be of a higher amplitude then the reflection off small vehicle 108 because large vehicle 106 is both larger and closer than small vehicle 108.

Figure 1B:
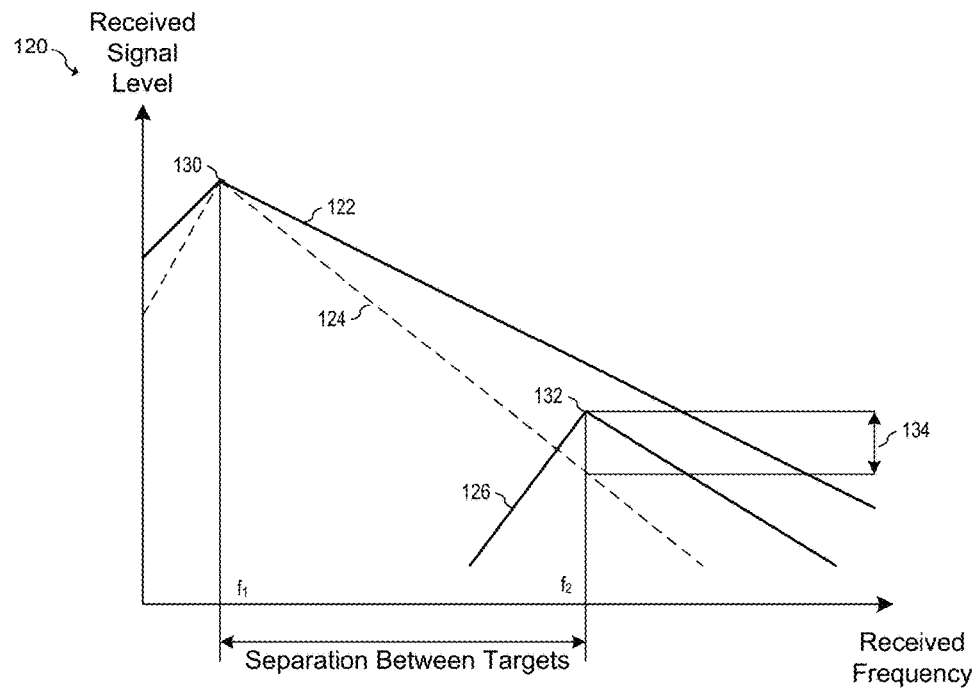

FIG. 1b illustrates a graph 120 of received signal level versus received frequency for the scenario of FIG. 1a. Signal level versus frequency curve 122 corresponds to the received reflection from large vehicle 106 and the frequency f1 of signal level peak 130 corresponds to the distance between automotive radar system 104 and large vehicle 106. Likewise, signal level versus frequency curve 126 corresponds to the received reflection from small vehicle 108 and the frequency F2 of the signal level peak 132 corresponds to the distance between automotive radar system 104 and small vehicle 108. Accordingly, the distance between large vehicle 106 and small vehicle 108 is proportional to the separation between frequencies F1 and F2.

Along with the desired output signal, the phase noise of the radar transmitter is also transmitted and reflected. The phase noise reflected from large vehicle 106 is represented as dashed line 124. As seen in graph 120, phase noise 124 affects the ability of the radar to receive signals reflected from small vehicle 108. The signal to noise ratio between signal level peak 132 due to small vehicle 108 and the corresponding noise floor due to phase noise reflected from large vehicle 106 is represented as length 134. It can be seen from the graph of FIG. 1B, that phase noise affects the ability of automotive radar system 104 to discern small and distant objects. The higher the phase noise of the radar transmitter, the less the radar system is able to discern small and distant objects.

Figure 1C:
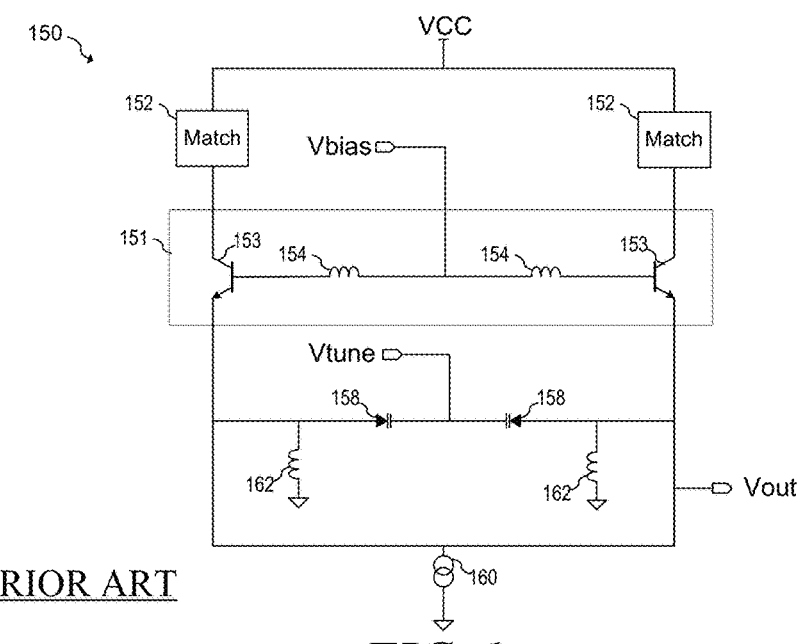

FIG. 1c illustrates conventional VCO 150 according to a "push-push" architecture. VCO includes VCO core 151 having transistors 153 and inductors 154, matching networks 152, varactors 158 and current source 160. Transistors 153 are biased according to bias voltage Vbias, and the capacitance of varactor 158 are tuned according to tuning voltage Vtune. The frequency of oscillation of VCO 150 is approximately:

$$f_{OSC} = \frac{1}{2\pi\sqrt{L_{154}C_{158}}},$$

where $L_{154}$ is the inductance of inductor 154 and $C_{158}$ is the capacitance of varactor 158. The output of VCO 150 is taken a Vout, which provides an output frequency of twice $f_{OSC}$.

Varactor 158 may be implemented as a diode capacitance that is inversely proportional to the voltage applied across its terminals. As shown, tuning voltage Vtune is coupled to the cathode of the varactor diodes that make up varactor 158. As the tuning voltage Vtune increases with respect to ground, the varactor diode becomes increasingly reversed bias and there is a corresponding decrease in the capacitance of varactor 158. This decrease in capacitance with respect to applied voltage may be due to the increase of the width of the depletion region in the reversed bias diode as the voltage across the diode increases. Since the frequency of oscillation $f_{OSC}$ of VCO 150 is inversely proportional to $C_{158}$ is the capacitance of varactor 158, the frequency of oscillation $f_{OSC}$ increases with a corresponding increase in tuning voltage Vtune.

An example relationship between the oscillation frequency $f_{OSC}$ with respect to tuning voltage Vtune is shown as curve 170 in FIG. 1d. Also shown in FIG. 1d is curve 172 that represents VCO gain Kvco with respect to Vtune and curve 174 that represents phase noise PNssb with respect to Vtune. As shown, phase noise PNssb decreases as the applied tuning voltage Vtune increases and VCO gain Kvco decreases.

Because the region of best phase noise performance corresponds to higher applied Vtune voltages, it may be challenging to design a low voltage system that utilizes such a VCO. For example, if the particular low voltage system, such as a PLL, is constrained to only deliver a tuning voltage between about 0.2 V and about 2.0 V, the system may not be able to operate the VCO in the lowest phase noise regions of operation. This may pose system design challenges in ensuring that the available tuning voltage range maps to the specified output frequency range that has sufficient phase noise performance.

Figure 1E:
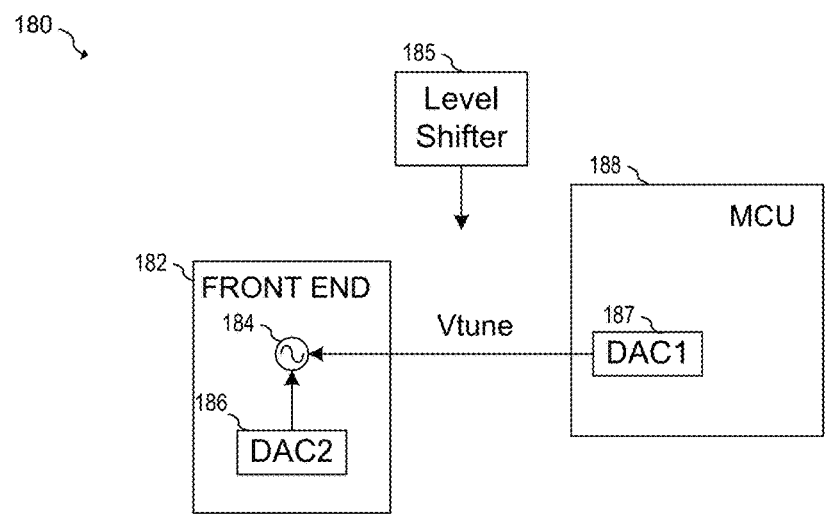

FIG. 1e illustrates a block diagram of an embodiment RF system 180 having front-end circuit 182 that includes RF oscillator 184 that has it frequency controlled by digital-to-analog converter (DAC) 187 in microcontroller unit (MCU) 188. As shown, front-end circuit 182 may be implemented in a separate package and/or on a separate integrated circuit die as MCU 188. In one embodiment, front-end circuit 182 may be implemented in a high performance RF process that implements RF transistors such as SiGe HPTs, and other types of transistors. MCU 188, on the other hand, may be implemented using a fine geometry CMOS process. In an embodiment, front-end circuit 182 may include a further DAC 186 to drive an additional tuning port. In some embodiments, the maximum power supply voltage that may be applied to MCU 188 is limited by the particular semiconductor process in which MCU 188 is fabricated. In some cases, this maximum power supply voltages may be about 1.2 V, however, different semiconductor processes may be able to tolerate different maximum supply voltages. In one example, the usable tuning voltage range that may be supplied by DAC may be between about 0.2 V and about 1 V. This tuning range may be modified using, for example, level shifter circuit 185.

In an embodiment, MCU 188 may be used to implement a digital and/or software-based PLL in addition to performing other functions for the particular RF system being implemented. Software PLLs may be used in embodiment radar or communication systems to take advantage of the lower phase noise at higher offset frequencies (i.e., 1 MHz offset) for a free running VCO compared to a PLL.

Figure 1F:
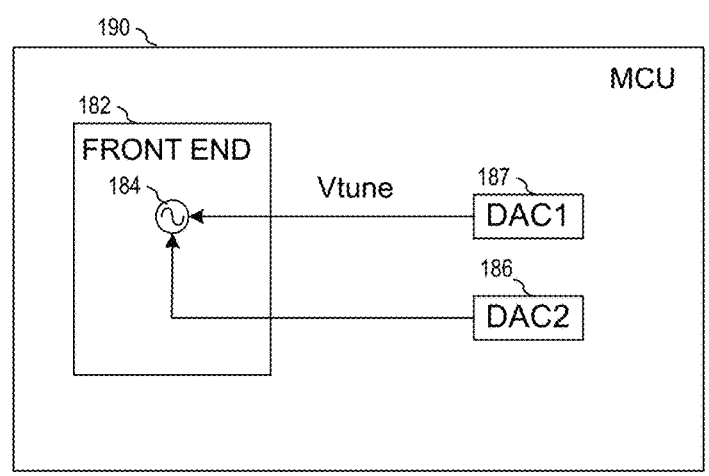

In accordance with a further embodiment, both the RF front-end circuit 182, as well as the MCU functions of the system may be implemented on a single MCU integrated circuit 190 as shown in FIG. 1f. MCU integrated circuit includes DACs 186 and 187 for tuning oscillator 184.

Figure 2:
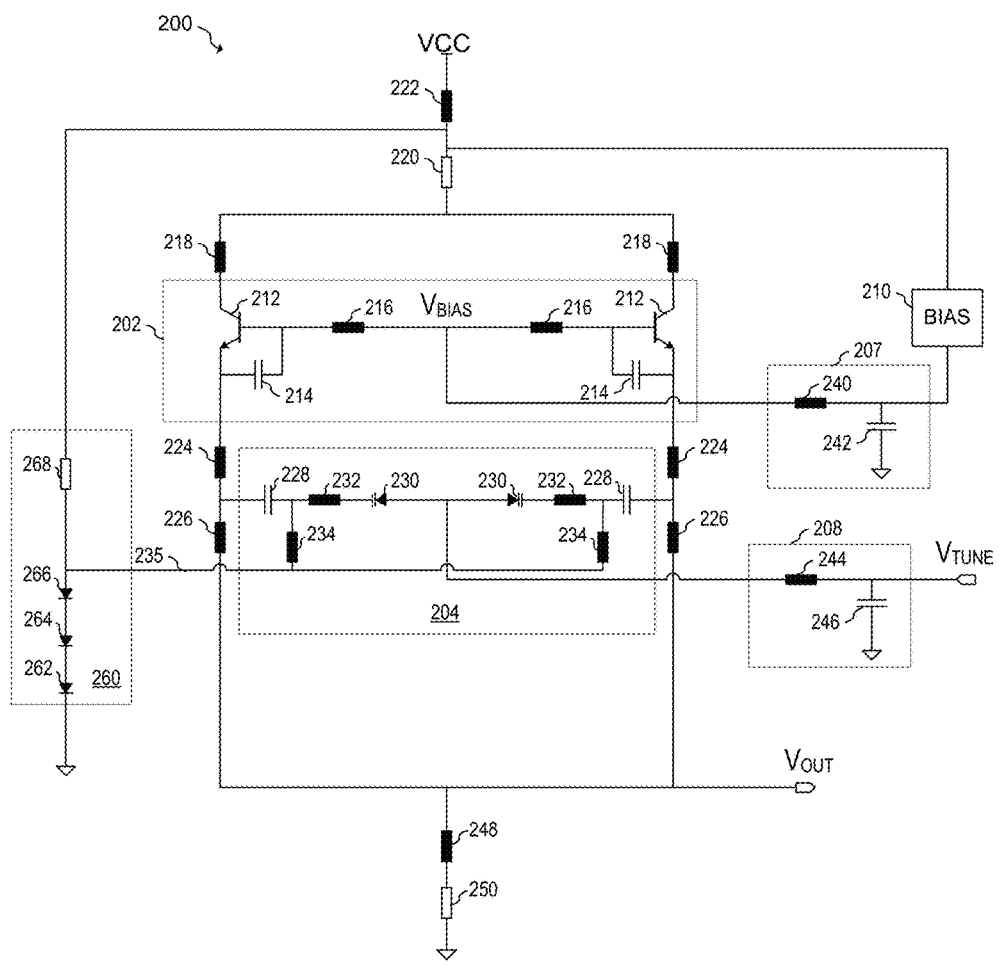
FIG. 2 illustrates a schematic of an embodiment VCO.

In an embodiment, the tuning characteristic of the VCO is inverted such that lower tuning voltages correspond to regions of operation having lower phase noise. FIG. 2 illustrates embodiment VCO 200 having such as tuning characteristic. As shown, VCO 200 includes VCO core 202, varactor circuit 204 containing varactors 230, and bias circuit 210 and voltage reference circuit 260. VCO core 202 includes transistors 212, capacitors 214 and transmission line elements 216. Transmission line elements 216, as well as other transmission line element used in VCO 200, may be implemented using microstrip structures and/or other transmission line structures known in the art. In an embodiment, VCO is configured to oscillate at a frequency between about 5 GHz and about 40 GHz, for example, about 20 GHz. However, in alternative embodiments, other oscillation frequency ranges may be used. Transmission line elements 216 are sized in order to produce an inductive impedance at the bases of transistors 212. Bias voltages to the bases of transistors 212 are provided by bias circuit 210 that is coupled to VCC via transmission line element 222. In an embodiment, transmission line element 222 is sized to be a quarter wavelength at twice the frequency of oscillation of the VCO 200. In some embodiments, bias voltage VBIAS is filtered via bias filtering network 207 having transmission line element 240 and capacitor 242. In some embodiments, transmission line element 240 has a quarter wavelength of about four times the oscillation frequency of VCO 200.

The collectors of transistors 212 are coupled to VCC via transmission line elements 218, feedback resistor 220 and transmission line element 222. In an embodiment, transmission line elements 218 are sized in order to maximize the signal swing. Feedback resistor 220, in some embodiments, mitigates the self-bias effect of high VCO amplitudes distorting the tuning curve of varactors 230 as described in U.S. patent application Ser. No. 14/041,931 filed on Sep. 30, 2013, which application incorporated herein by reference in its entirety. In some embodiments, the resistance of feedback resistor is between about 5Ω and about 10Ω for a bias current of about 20 mA. Alternatively, bias currents and other resistance values for feedback resistor 220 may be used.

Varactor circuit 204 includes varactor elements 230, AC coupling capacitors 228, series transmission line elements 232, and RF choke circuits that include transmission line element 234. In some embodiments, a bias voltage is provided to the varactor circuit via transmission element 234. Node 235 that provides this bias voltage may be referred to as a varactor reference terminal. As shown, the anodes of varactor elements 230 are coupled to tuning voltage Vtune. In some embodiments, tuning voltage $V_{TUNE}$ is filtered via bias filtering network 208 having transmission line element 244 and capacitor 246. In some embodiments, transmission line element 240 has a quarter wavelength of about four times the oscillation frequency of VCO 200. The combination of each RF choke circuit and transmission line element 232 may form an inductive voltage divider. In an embodiment, AC coupling capacitors 228 allow varactors 230 to be biased based on applied tuning voltage Vtune and reference voltage Vn1. Series transmission line elements 232 and AC coupling capacitors 228 form a series resonant circuit that allows the fundamental frequency of oscillator pass to varactors while attenuating the harmonics of VCO 200. In some embodiments, series transmission line elements 232 may be implemented using a transmission line having a length of about 400µ in one example. In another example, the length of series transmission line elements 232 may be between about 100µ and about 500µ. It should be understood, however, that the length of series transmission line elements 232 may be outside of this range depending on the embodiment and its particular specifications. In some alternative embodiments, series transmission line elements 232 may be implemented using an inductive element.

In an embodiment, the RF choke circuit that includes transmission line elements 234, 236 and capacitor 238 produces a high impedance to the emitters of transistors 212 at about twice the oscillation frequency of VCO 200, and provides a lower impedance at other harmonics of the oscillation frequency. By providing a lower impedance to oscillation harmonics via series transmission line element 232 and the RF choke circuit, phase noise may be improved because of reduced non-linear behavior of the varactor.

Voltage reference circuit 260 provides a bias voltage to the cathode of varactors 230. In an embodiment, voltage reference circuit 260 includes resistor 268 coupled to VCC via transmission line element 222 and diodes 262, 264 and 266. In alternative embodiments of the present invention, voltage reference circuit 260 may include greater or fewer than the three diodes 262, 264 and 266 depicted in FIG. 2.

In an embodiment, the voltage across diodes 262, 264 and 266 define the voltage range of Vtune. For example, the VCO 200 may have a tuning voltage range of between about 0V and about three diode drops. If diodes 262, 264 and 266 are silicon diodes having a forward voltage of about 0.7V, the input tuning voltage range is between 0 V and about 2.1V.

In an embodiment, sensitivity of the varactor capacitance to power supply voltage VCC is reduced as a function of using resistor 268. For example, as the power supply VCC decreases, the current through resistor 268 decreases, thereby causing a corresponding decrease in the voltage across resistor 268. This reduction in voltage across resistor 268 reduces attenuates the decrease in voltage seen across varactor 230.

Output $V_{OUT}$ of VCO 200 is coupled to the emitters of transistors 212 via transmission line elements 224 and 226 that isolate the VCO core from the output, thereby forcing the fundamental signal of the VCO to remain in the VCO core. Thus, the output frequency of VCO 200 is twice the oscillation frequency of the VCO core. This also improves the quality factor of the resonator and leads to better phase noise performance. The tail current for transistors 212 is provided by transmission line element 248 and bias resistor 250. In an embodiment, transmission line element 248 has a quarter wavelength at twice the frequency of oscillation of VCO 200.

It should be understood that, in some embodiments, the sizing of transmission elements within VCO 200 may vary from the lengths and corresponding wavelengths described above depending on the particular embodiment and its specifications.

Figure 3:
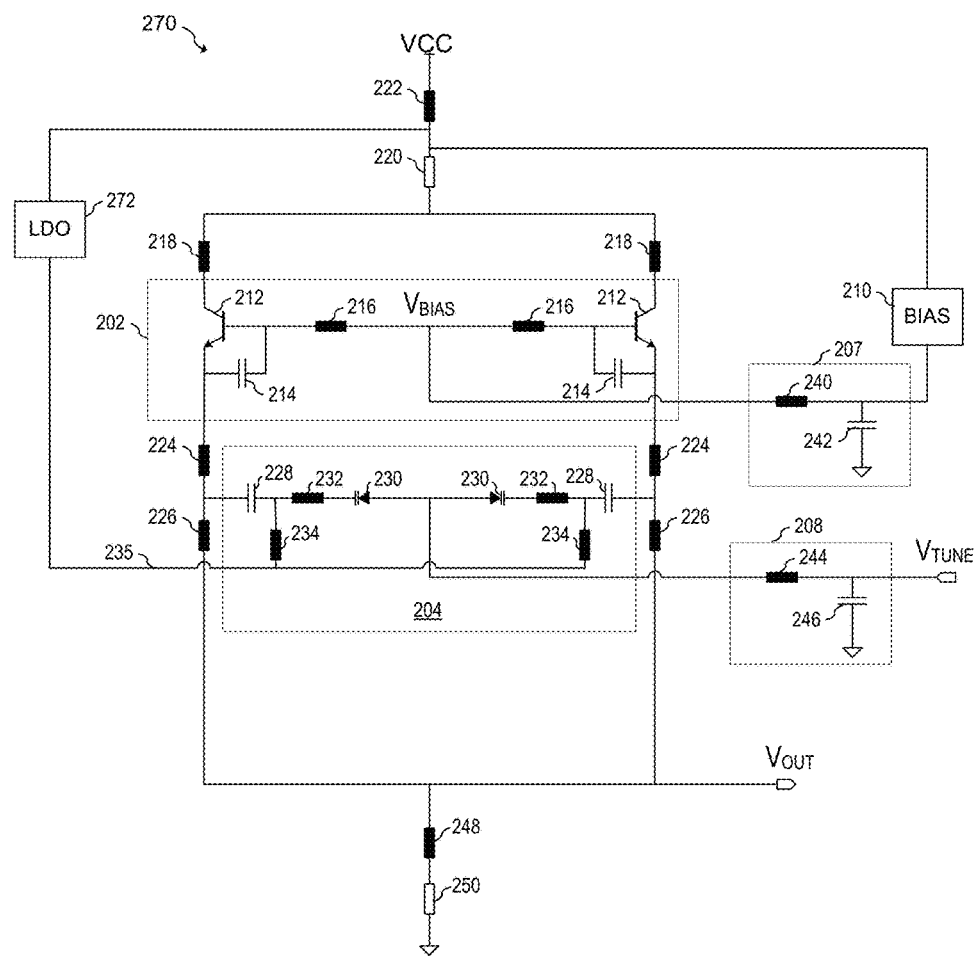
FIG. 3 illustrates a schematic of another embodiment VCO.

FIG. 3 illustrates VCO 270 according to a further embodiment of the present invention. VCO 270 is similar to VCO 200 shown in FIG. 2, with the exception that the cathodes of varactors 230 are referenced using low dropout voltage regulator (LDO) 272 instead of voltage reference circuit 260. LDO 272 may be implemented, for example, using low dropout voltage regulators known in the art, for example, a linear regulator using a series pass transistor. Alternatively, other known voltage regulator circuits may be used. In some embodiments, LDO 272 is implemented using low noise circuitry. LDO 272 may be implemented on a same integrated circuit as VCO 270 or may be implemented external to VCO 270 in some embodiments.

Figure 4:
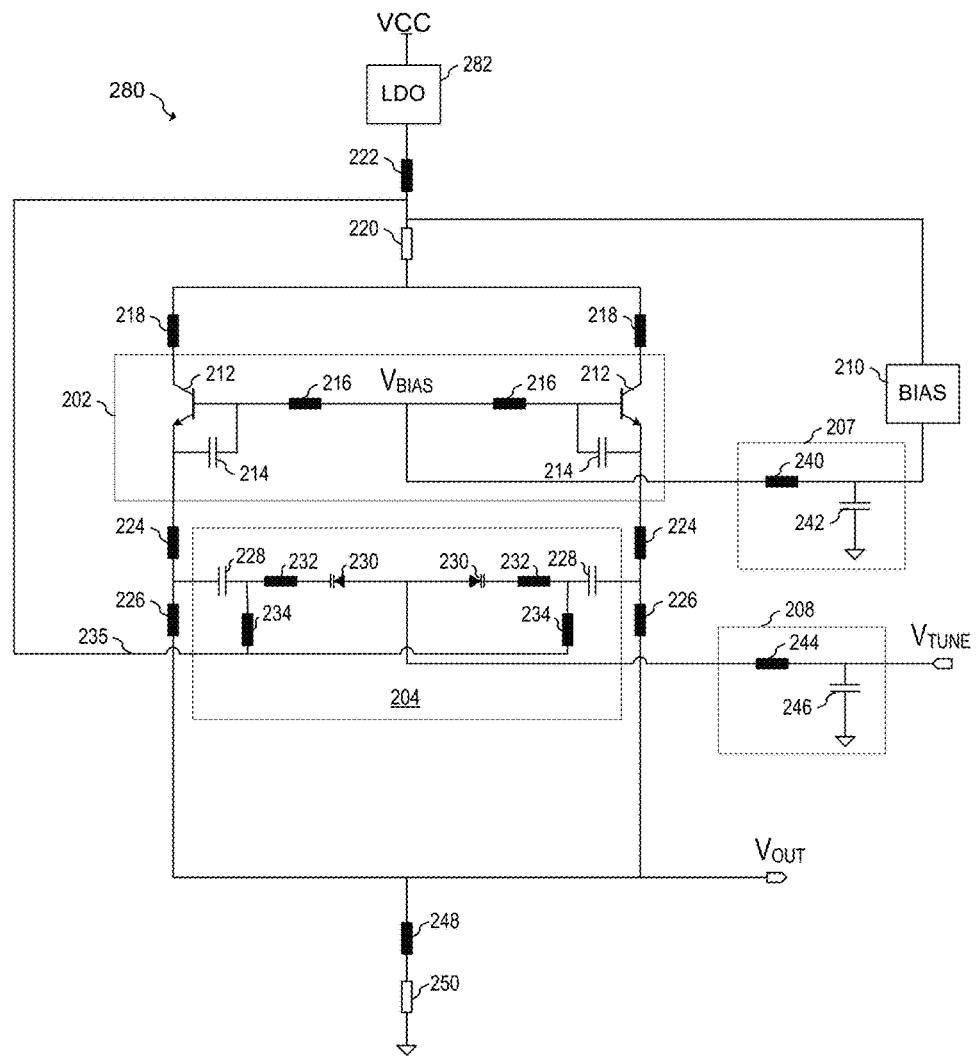
FIG. 4 illustrates a schematic of a further embodiment VCO.

FIG. 4 illustrates VCO 280 according to another embodiment of the present invention. VCO 280 is similar to VCO 270 shown in FIG. 3, with the exception that LDO 282 is coupled between VCC and transmission line element 222. As shown, the cathodes of varactors 230 are connected to transmission line element 222 via the RF choke circuits implemented by transmission elements 234. In embodiments, LDO 282 may be implemented on the same integrated circuit as VCO 280 or external to the integrated circuit on which VCO 280 is disposed.

Figure 5:
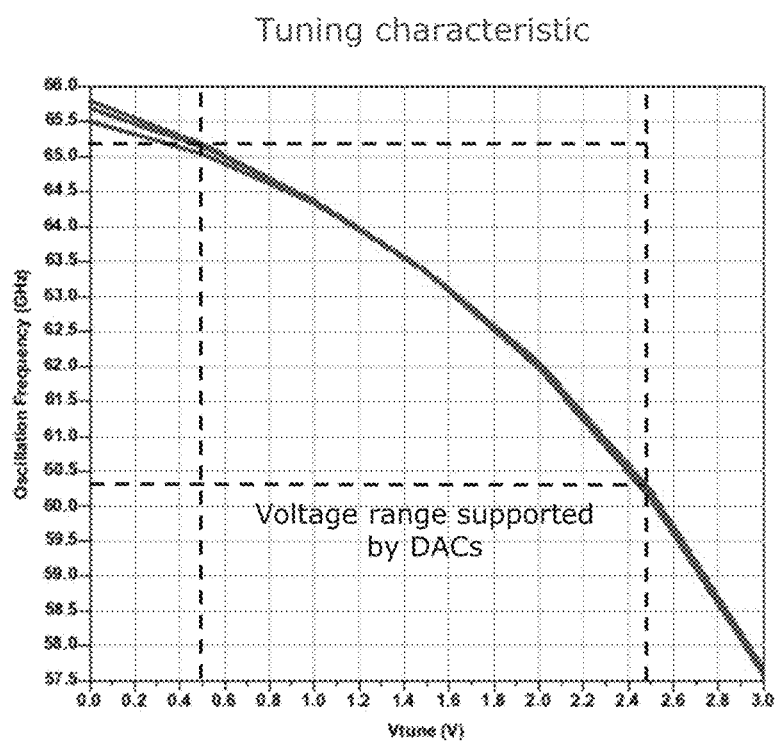
FIG. 5 illustrates a frequency versus tuning voltage graph for an embodiment VCO.

FIG. 5 illustrates a plot of oscillation frequency with respect to applied tuning voltage Vtune for an embodiment VCO. As shown, the oscillation frequency decreases as the applied tuning voltage Vtune increases. In the particular tuning curve shown, an oscillation frequency range about 60.25 GHz to about 65.25 GHz may be tuned with an applied tuning voltage of between about 0.5 V and about 2.5 V. In many embodiments, this voltage range is supported using DACs implemented in various standard CMOS semiconductor processes.

Figure 6:
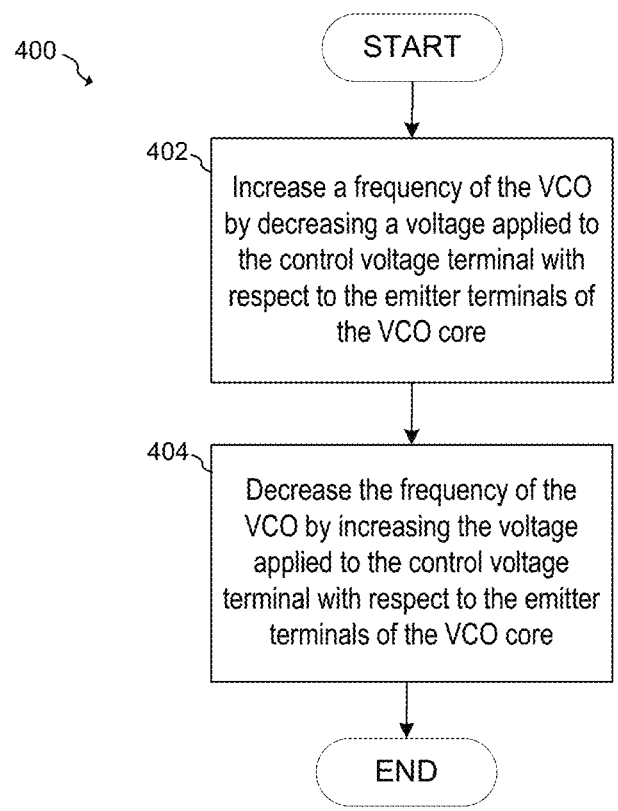
FIG. 6 illustrates a block diagram of an embodiment method.
Figure 7:
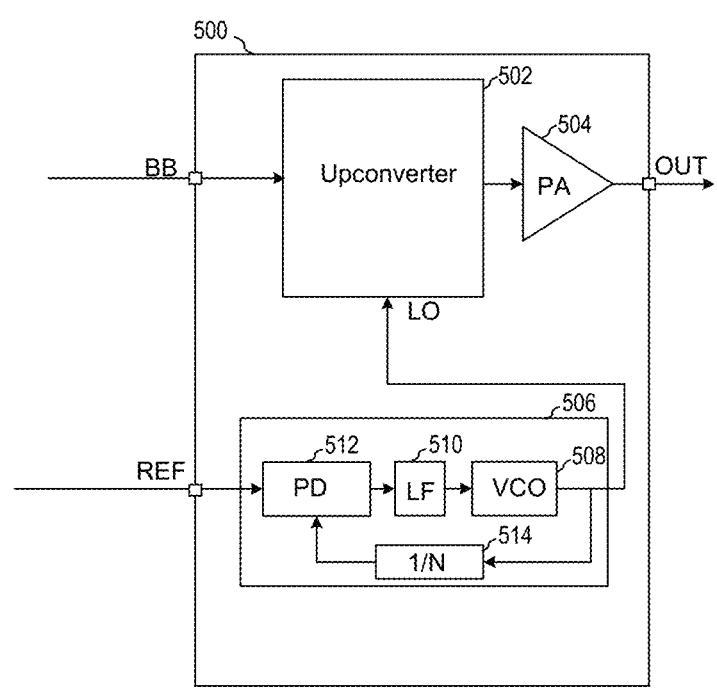
FIG. 7 illustrates an embodiment radar system.

FIG. 6 illustrates a block diagram 400 of an embodiment method of operating an embodiment VCO that includes a VCO core having a plurality of transistors and a varactor circuit having a first end coupled to emitter terminals of the VCO core and a second end coupled to a tuning terminal. As discussed according to embodiments herein, the varactor circuit includes a capacitance that increases with increasing voltage applied to the tuning terminal with respect to the emitter terminals of the VCO core.

In step 402, the frequency of the VCO is increased by decreasing a voltage applied to the tuning terminal with respect to the emitter terminals of the VCO core. In step 404, the frequency of the VCO is decreased by increasing the voltage applied to the tuning terminal with respect to the emitter terminals of the VCO core. By performing steps 402 and 404 the frequency of oscillation may be tuned. In embodiment, step 402 in which the frequency of the VCO is increased by decreasing the tuning voltage of the VCO allows the VCO to operate in a lower phase noise region of operation.

FIG. 5 illustrates single-chip radar transmission system 500 that includes upconverter 502, power amplifier 504 and frequency generation circuit 506. As shown, upconverter 502 upconverts baseband signal BB to a higher frequency signal, which is then amplified by power amplifier 504 and output on pin OUT. In some embodiments, baseband signal BB may be a swept frequency or other signal type used in a radar system. Frequency generation circuit 506 produces local oscillator signal LO based on a reference frequency on pin REF that may be generated using, for example, a crystal oscillator. In an embodiment, frequency generation circuit 506 is implemented using a phase locked loop (PLL) having phase detector 512, loop filter 510, VCO 508 and divider 514. VCO 508 may be implemented using embodiment VCOs described herein. In some embodiments, the function of phase detector 512, loop filter 510 may be performed digitally using digital circuits and systems known in the art, as well as using analog circuitry. For example, these functions may be implemented using custom digital logic, standard cell digital logic, and/or may be implemented in software running on a processor, microcontroller or digital signal processor. Such processors may include, for example, a processor core, memory coupled to the processor core and one or more input/output ports. Alternatively, other circuits and systems known in the art may be used to implement these functions. It should be appreciated that system 500 is just one of many examples of embodiment systems that may utilize embodiment oscillators. Alternative systems may include, for example, wireless and wire line communication systems, and other systems that use VCOs.

In accordance with an embodiment, a voltage controlled oscillator (VCO) includes a VCO core having a plurality of transistors and a varactor circuit that has a first end coupled to emitter terminals of the VCO core and a second end coupled to a tuning terminal. The varactor circuit includes a capacitance that increases with increasing voltage applied to the tuning terminal with respect to the emitter terminals of the VCO core.

Implementations may include one or more of the following features. In an embodiment, the varactor circuit includes: a first capacitor having a first terminal coupled to a first of the emitter terminals of the VCO core; a first varactor diode having a cathode coupled to a second terminal of the first capacitor and an anode coupled to the tuning terminal; and an RF choke circuit coupled between a second terminal of the first capacitor and a varactor reference terminal. The VCO may further include a voltage reference circuit coupled to the varactor reference terminal. In some embodiments, the voltage reference circuit includes: a resistor coupled between a first reference terminal and the varactor reference terminal, where the first reference terminal is coupled to collector terminals of the VCO core; and a diode coupled between the varactor reference terminal and a second reference terminal. This diode may include a plurality of diodes and/or the second reference terminal may be a ground terminal.

In an embodiment, the voltage reference circuit includes a voltage regulator coupled between the varactor reference terminal and a first reference terminal. The voltage regulator may include, for example, a low dropout (LDO) voltage regulator. The first reference terminal may be coupled to collector terminals of the VCO core and/or the collector terminals of the VCO core may be coupled to the varactor reference terminal. The varactor reference terminal may be coupled to the collector terminals of the VCO core via a second resistor.

In some embodiments, the VCO includes an output node coupled to the emitter terminals of the VCO core. The VCO may have a frequency of operation between about 10 GHz and about 30 GHz.

In accordance with a further embodiment, a VCO includes a VCO core having a plurality of transistors and a varactor circuit coupled to emitter terminals of the VCO core. The varactor circuit includes a first capacitor having a first terminal coupled to a first of the emitter terminals of the VCO core, a first transmission line element having a first terminal coupled to a second terminal of the first capacitor, a first varactor diode having a cathode coupled to the second terminal of the first transmission line element, an anode coupled to a tuning terminal, and an RF choke circuit coupled between a second terminal of the first capacitor and a varactor reference terminal. The VCO further includes a feedback resistor coupled between a first reference terminal and the VCO core and a voltage reference circuit having an output node coupled to the varactor reference terminal.

Implementations may include one or more of the following features. The voltage reference circuit includes: a first resistor coupled between the first reference terminal and the varactor reference terminal; and at least one diode coupled between the varactor reference terminal and a second reference terminal. The VCO may further include a bias resistor coupled between the emitter terminals of the VCO core and the second reference terminal.

In some embodiments, the voltage reference circuit includes a voltage regulator, which may be coupled between the first reference terminal and the varactor reference terminal. In some implementations, the voltage regulator is coupled between the first reference terminal and the feedback resistor, and the varactor reference terminal is coupled to the feedback resistor.

In accordance with another embodiment, a method of operating a VCO includes increasing a frequency of the VCO by decreasing a voltage applied to a tuning terminal with respect to emitter terminals of the VCO core; and decreasing the frequency of the VCO by increasing the voltage applied to the tuning terminal with respect to the emitter terminals of the VCO core. The VCO includes a VCO core that includes a plurality of transistors and a varactor circuit having a first end coupled to emitter terminals of the VCO core and a second end coupled to a tuning terminal, where the varactor circuit includes a capacitance that increases with increasing voltage applied to the tuning terminal with respect to the emitter terminals of the VCO core.

Implementations may include one or more of the following features. The method where the varactor circuit includes a first capacitor having a first terminal coupled to a first of the emitter terminals of the VCO core, a first varactor diode having a cathode coupled to a second terminal of the first capacitor and an anode coupled to the tuning terminal, and an RF choke circuit coupled between a second terminal of the first capacitor and a varactor reference terminal. In some embodiments, the method further includes biasing the varactor reference terminal. Biasing the varactor reference terminal may include applying an output of a voltage reference circuit to the varactor reference terminal.

Advantages of embodiments of the present invention include ability to generate a frequency having very low phase noise. A further advantage includes, for example, a wide VCO tuning range.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A voltage controlled oscillator (VCO) comprising:
 a VCO core comprising a plurality of transistors;
 a varactor circuit having a first end coupled to emitter terminals of the VCO core and a second end coupled to a tuning terminal, wherein the varactor circuit comprises a capacitance that increases with increasing voltage applied to the tuning terminal with respect to the emitter terminals of the VCO core, the varactor circuit comprising
   a first capacitor having a first terminal coupled to a first of the emitter terminals of the VCO core,
   a first varactor diode having a cathode coupled to a second terminal of the first capacitor and an anode coupled to the tuning terminal, and
   an RF choke circuit coupled between a second terminal of the first capacitor and a varactor reference terminal; and
 an output node coupled to the emitter terminals of the VCO core.

2. The VCO of claim 1, further comprising a voltage reference circuit coupled to the first end of the varactor circuit.

3. The VCO of claim 1, wherein collector terminals of the VCO core are coupled to the first end of the varactor circuit.

4. The VCO of claim 3, wherein the first end of the varactor circuit is coupled to the collector terminals of the VCO core via a second resistor.

5. A voltage controlled oscillator (VCO) comprising:
 a VCO core comprising a plurality of transistors; and
 a varactor circuit having a first end coupled to emitter terminals of the VCO core and a second end coupled to a tuning terminal, wherein the varactor circuit comprises:
   a first capacitor having a first terminal coupled to a first of the emitter terminals of the VCO core,
   a first varactor diode having a cathode coupled to a second terminal of the first capacitor and an anode coupled to the tuning terminal, and
   an RF choke circuit coupled between a second terminal of the first capacitor and a varactor reference terminal.

6. The VCO of claim 5, further comprising a voltage reference circuit coupled to the varactor reference terminal.

7. The VCO of claim 6, wherein the voltage reference circuit comprises:
 a resistor coupled between a first reference terminal and the varactor reference terminal, wherein the first reference terminal is coupled to collector terminals of the VCO core; and
 a second diode coupled between the varactor reference terminal and a second reference terminal.

8. The VCO of claim 7, wherein the second diode comprises a plurality of diodes.

9. The VCO of claim 7, wherein the second reference terminal is a ground terminal.

10. The VCO of claim 6, wherein the voltage reference circuit comprises a voltage regulator coupled between the varactor reference terminal and a first reference terminal.

11. The VCO of claim 10, wherein the voltage regulator comprises a low dropout (LDO) voltage regulator.

12. The VCO of claim 10, wherein the first reference terminal is coupled to collector terminals of the VCO core.

13. The VCO of claim 10, wherein collector terminals of the VCO core are coupled to the varactor reference terminal.

14. The VCO of claim 13, wherein the varactor reference terminal is coupled to the collector terminals of the VCO core via resistor.

15. The VCO of claim 5, wherein the VCO comprises an output node coupled to the emitter terminals of the VCO core.

16. The VCO of claim 5, wherein the VCO comprises a frequency of operation between about 10 GHz and about 30 GHz.

17. A method of operating a voltage controlled oscillator (VCO) comprising a VCO core having a plurality of transistors and a varactor circuit having a first end coupled to emitter terminals of the VCO core and a second end coupled to a tuning terminal, wherein the varactor circuit comprises a first capacitor having a first terminal coupled to a first of the emitter terminals of the VCO core, a first varactor diode having a cathode coupled to a second terminal of the first capacitor and an anode coupled to the tuning terminal, and an RF choke circuit coupled between a second terminal of the first capacitor and a varactor reference terminal, the method comprising:
 increasing a frequency of the VCO by decreasing a voltage applied to the tuning terminal with respect to the emitter terminals of the VCO core; and
 decreasing the frequency of the VCO by increasing the voltage applied to the tuning terminal with respect to the emitter terminals of the VCO core.

18. The method of claim 17, further comprising biasing the varactor reference terminal.

19. The method of claim 18, wherein biasing the varactor reference terminal comprises applying an output of a voltage reference circuit to the varactor reference terminal.

* * * * *